United States Patent
Schwab et al.

(10) Patent No.: US 9,240,563 B2
(45) Date of Patent: Jan. 19, 2016

(54) MULTI-DEVICE OLED

(75) Inventors: Holger Schwab, Aachen (DE); Volker Lambert Van Elsbergen, Aachen (DE); Herbert Friedrich Boerner, Aachen (DE); Detlef Raasch, Roetgen (DE); Sören Hartmann, Baesweiler (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/877,665

(22) PCT Filed: Sep. 29, 2011

(86) PCT No.: PCT/IB2011/054292
§ 371 (c)(1),
(2), (4) Date: Apr. 4, 2013

(87) PCT Pub. No.: WO2012/049580
PCT Pub. Date: Apr. 19, 2012

(65) Prior Publication Data
US 2013/0187148 A1 Jul. 25, 2013

(30) Foreign Application Priority Data
Oct. 11, 2010 (EP) .................................... 10187117

(51) Int. Cl.
*H01L 51/00* (2006.01)
*H01L 51/52* (2006.01)
(Continued)

(52) U.S. Cl.
CPC ............ *H01L 51/52* (2013.01); *H01L 27/3209* (2013.01); *H01L 51/5203* (2013.01); *H01L 51/56* (2013.01)

(58) Field of Classification Search
CPC ............ H01L 27/3209; H01L 27/3223; H01L 33/0896; H01L 2227/32; H01L 51/52; H01L 51/5203; H01L 51/56

USPC ................. 257/40, 59, 72, 79, 88, 89, 90, 93, 257/E51.001, E51.018, E51.022, E25.001, 257/E25.008; 313/483, 498, 504, 505, 506; 438/99
See application file for complete search history.

(56) References Cited

U.S. PATENT DOCUMENTS 4,442,966 A * 4/1984 Jourdain et al. ........... 228/122.1
5,757,026 A    5/1998 Forrest et al.
(Continued)

FOREIGN PATENT DOCUMENTS

EP    2144290 A1    1/2010
JP    200727367 A   2/2007
(Continued)

*Primary Examiner* — Galina Yushina
(74) *Attorney, Agent, or Firm* — Yuliya Mathis

(57) ABSTRACT

The invention describes a multi-device OLED (1) comprising a device layer stack (100) comprising a bottom electrode (11), a top electrode (14), at least one inter electrode (13) and plurality of active layers (120, 121), wherein the bottom electrode (11) is applied to a substrate (10), and each active layer (120, 121) is enclosed between two electrodes (11, 13, 14); a current distribution means (500) comprising a current distribution layer (51, 53, 54) for each electrode (11, 13, 14) of the device layer stack (100); a plurality of openings (110, 130) extending from the top electrode (14) into the device layer stack (100), wherein each opening (110, 130) exposes a contact region (111, 131) of an electrode (11, 13); and a plurality of electrical connectors (41, 42), wherein an electrical connector (41, 42) extends into an opening (110, 130) to electrically connect the electrode (11, 13) exposed by that opening (110, 130) to the current distribution layer (53, 54) for that electrode (11, 13). The invention also describes a method of manufacturing such a multi-device OLED. The invention further describes a method of driving such a multi-device OLED, which method comprises applying a voltage across at least one pair (51, 53, 53, 54) of current distribution layers (51, 53, 54) of the current distribution means (500) to stimulate the corresponding active layer (120, 121) of a device of the multi-device OLED (1).

11 Claims, 6 Drawing Sheets

(51) Int. Cl.
   *H01L 27/32*   (2006.01)
   *H01L 51/56*   (2006.01)
   *H01L 51/40*   (2006.01)

(56) References Cited

U.S. PATENT DOCUMENTS

| | | | |
|---|---|---|---|
| 8,053,977 B2 * | 11/2011 | Lifka | A61N 5/0616 313/504 |
| 2003/0043316 A1 | 3/2003 | Matsumoto et al. | |
| 2004/0032220 A1 * | 2/2004 | Cok | H01L 27/3204 315/291 |
| 2004/0195572 A1 | 10/2004 | Kato et al. | |
| 2005/0236981 A1 * | 10/2005 | Cok et al. | 313/504 |
| 2006/0145596 A1 | 7/2006 | Coe | |
| 2007/0132369 A1 | 6/2007 | Forrest et al. | |
| 2008/0252205 A1 * | 10/2008 | Young | H01L 51/0006 313/504 |
| 2008/0265754 A1 * | 10/2008 | Young et al. | 313/504 |
| 2009/0091248 A1 * | 4/2009 | Kim et al. | 313/504 |

FOREIGN PATENT DOCUMENTS

| | | |
|---|---|---|
| WO | 2006087653 A2 | 8/2006 |
| WO | 2007013001 A2 | 2/2007 |
| WO | 2008152840 A1 | 3/2008 |
| WO | 2010005301 A1 | 1/2010 |

* cited by examiner

A)

B)

C)

D)

E)

F)

G)

MULTI-DEVICE OLED

FIELD OF THE INVENTION

The invention describes a multi-device OLED and a method of manufacturing a multi-device OLED.

BACKGROUND OF THE INVENTION

With advances in OLED technology, allowing several OLED devices to be stacked in a multi-device configuration, 'colour-tuneable' devices are becoming interesting. In a single-unit device, an active layer is sandwiched between a top electrode and a bottom electrode. The colour of the emitted light is largely determined by the composition of the active layer, which can comprise various organic polymers such as polyfluorenes chosen for their specific chemical structure that allows the colour of the emitted light to be determined. A single-unit device emits light of a certain colour, and that colour cannot be altered dynamically. A multi-device OLED, on the other hand, comprises two or more OLED devices or units 'stacked' on top of each other such that the anode of one unit is the cathode of the other unit in the stack. This shared or 'inter' electrode is effectively sandwiched between the different active layers of the multi-device OLED. The separate active layers can have different layer composition so that each OLED device or unit can have a different colour. The colour of the light emitted by the combined OLED devices can be tuned by regulating the current supplied to the electrodes, while an 'inter' electrode is used to drive one or both of its adjacent OLED devices. Obviously, the inter electrode must be at least partially transparent. A prior art colour-tuneable multi-device OLED comprising two stacked units is made by applying at least three isolated electrically conductive regions onto a substrate, which may be glass, polyethylene naphtalate, or some other suitable material, usually transparent since most devices are 'bottom emitting', i.e. they emit through the substrate. A transparent conductor is used for these conductive regions, for example doped zinc oxide, indium tin oxide or poly(3,4-ethylenedioxythiophene) poly(styrenesulfonate), usually referred to as Pedot:PSS. These conductive regions are applied such that a relatively large central anode region is flanked on one side by a contact pad for the inter electrode and on the other side by a contact pad for the cathode. A first active layer is applied onto the anode, and an inter electrode layer is applied to cover the first active layer, extending onto one of the contact pads. A second active layer is applied onto the inter electrode, and a third electrode is applied onto the second active layer, extending onto the other contact pad. For a bottom-emitting device, the third or top electrode can comprise a relatively thick layer of a highly reflective material such as aluminium or silver.

Because the three electrodes of such a prior art device can be addressed individually, the light emission of the two OLED units can be tuned relative to each other. With different organic materials for the two units, the light emitted by the top unit can have a slightly or even distinctly different colour from the light emitted by the bottom unit, allowing the combined colour or colour point of the combined device to be tuned simply by regulating the current applied to the electrodes.

However, the prior art design is associated with several drawbacks. The achievable device size is limited by the poor conductivity of the transparent anode. Also, since the inter electrode must be at least partially transparent, this layer must be very thin, with the result that its lateral conductivity is also inherently poor. The poor conductivity of the transparent electrodes effectively limits the device size to a maximum of about 5 cm by 5 cm. Another disadvantage is the inhomogeneous quality of the emitted light owing to the asymmetric contacting of the inter electrode and the cathode, so that the brightness of the light is uneven and drops off with increasing distance from the contact pads. Furthermore, the light-emitting area of the overall device is further restricted by the necessity for these contact pads, which occupy a significant portion of the available substrate area.

It is therefore an object of the invention to provide an improved multi-device OLED.

SUMMARY OF THE INVENTION

This object is achieved by a multi-device OLED according to claim 1, a method according to claim 10 of manufacturing a multi-device OLED, and a method according to claim 15 of driving a multi-device OLED.

According to the invention, the multi-device OLED comprises
- a device layer stack comprising a bottom electrode, a top electrode, at least one inter electrode and plurality of active layers, wherein the bottom electrode is applied to a substrate, and each active layer is enclosed or sandwiched between two electrodes;
- a current distribution means comprising a current distribution layer for each electrode of the device layer stack;
- a plurality of openings extending from the top electrode into the device layer stack, wherein each opening exposes a contact region of an electrode; and
- a plurality of electrical connectors, wherein an electrical connector extends into an opening to electrically connect the electrode exposed by that opening to the current distribution layer for that electrode.

In the following, using the accepted convention, it may be assumed that the first electrode is applied onto a substrate, followed by the subsequent layers of the device layer stack. Such a multi-device OLED with a single inter electrode and two active layers effectively comprises two stacked OLED devices that share that inter electrode. A multi-device OLED with two inter electrodes and three active layers effectively comprises three stacked OLED devices, whereby each inter electrode is shared by two adjacent devices of the stack.

An advantage of the multi-device OLED according to the invention is that the device layer stack can be built up on the substrate without the need for any additional contact pads along the sides for contacting the inter electrodes and the top electrode. Instead, the current distribution means is used to supply current directly to the exposed contact regions of the bottom electrode and any inter electrode through the openings in the device layer stack. As the skilled person will appreciate, supplying the electrodes with current in this way can compensate for the poor lateral conductivity of the thin or transparent electrodes so that the brightness of the device is favourably homogenous compared to a prior art multi-device OLED, whose brightness is unevenly distributed since the electrodes can only be contacted along the sides of the device. Furthermore, since there is essentially no limit to the number of openings that can be formed through the device layer stack of the multi-device OLED according to the invention, and since current can optimally be supplied to the electrodes using the current distribution layers, the multi-device OLED according to the invention is effectively not subject to any size restriction and is therefore suitable for a wide range of applications such as decorative lighting, signage, etc.

According to the invention, the method of manufacturing a multi-device OLED comprises the steps of assembling a device layer stack comprising a bottom electrode, a top electrode, at least one inter electrode and plurality of active layers, wherein the bottom electrode is applied to a substrate, and each active layer is sandwiched between two electrodes;

assembling a current distribution means comprising a current distribution layer for each electrode of the device layer stack;

forming a plurality of openings extending from the top electrode into the device layer stack, wherein each opening exposes a contact region of an inter electrode or the bottom electrode; and positioning an electrical connector into each opening to electrically connect the electrode exposed by that opening to the current distribution layer for that electrode.

In the method according to the invention, the layers of the device layer stack can simply be applied successively as full-area coatings without requiring additional contact pads for inter electrodes and the top electrode. Particularly the active layers can simply be applied by vapour deposition and can cover the entire underlying surface, since there is no need to avoid coating any particular region, unlike in prior art manufacturing techniques, in which care must be taken to avoid depositing active layer material on a contact pad for an electrode, as already described in the introduction.

According to the invention, the method of driving such an multi-device OLED comprises applying a voltage across at least one pair of current distribution layers of the current distribution means to stimulate the corresponding active layer of a device of the multi-device OLED, which active layer is sandwiched or enclosed between the electrode pair connected to that pair of current distribution layers.

The dependent claims and the following description disclose particularly advantageous embodiments and features of the invention. Features of the embodiments may be combined as appropriate to arrive at further embodiments.

The multi-device OLED according to the invention can be realised as a top-emitting or a bottom-emitting device. However, for the sake of simplicity but without restricting the invention in any way, it may be assumed in the following that the multi-device OLED is a bottom-emitting device, and that the device layer stack is applied onto a transparent substrate such as glass or a coated PEN foil. It may also be assumed in the following that the anode of the lowest device (using the convention that the substrate is 'underneath') is applied directly onto the substrate, and that this anode is transparent. It may also be assumed that an inter electrode also comprises a transparent conductive material. Following this convention, the top electrode (i.e. the electrode furthest away from the substrate) is the cathode of the uppermost OLED device of the device stack.

Current can be supplied to the electrode of the device layer stack using any suitably constructed current distribution means. For example, a current distribution means can comprise a conductor for each electrode of the device layer stack, applied in some appropriate manner to the device layer stack. In one approach, the electrical connectors for a specific electrode can be connected by printing a suitable pattern for a conductor to join all these connectors, whereby the printed conductor for each polarity, i.e. for a specific electrode, is separated from the other printed conductors by a suitable insulating layer. In a particularly preferred embodiment of the invention, the current distribution means comprises a contact layer stack with a plurality of insulating layers, wherein each insulating layer is sandwiched between two current distribution layers, and wherein each current distribution layer of the contact layer stack is preferably allocated to one electrode of the device layer stack. In this way, the current distribution layers can be arranged effectively one on top of the other, so that each current distribution layer can have an area comparable to the light-emitting area of the multi-device OLED. For example, if the contact layer stack is realised as a 'lid' and is placed over the device layer stack, the lower current distribution layer 'faces' the top electrode (but need not actually touch it, as will be explained below). In this way, the contact layer stack acts as a functional multi-polar lid, since it can be used to apply voltages of different polarities to specific electrodes of the device layer stack.

In a further preferred embodiment of the invention, the current distribution means comprises a plurality of vias extending from the lowest current distribution layer into the contact layer stack, wherein each via exposes a contact region of one current distribution layer. In this way, access can be provided to each of the current distribution layers in a particularly simple fashion.

To drive the multi-device OLED, a voltage must be applied across the anode and cathode of each OLED device of the device stack so that current can flow through the appropriate active layer. Since each current distribution layer of the contact layer stack is allocated to and connected to one electrode of the device layer stack, a device of the multi-device OLED can be driven by applying a voltage across the corresponding current distribution layers. Therefore, in a preferred embodiment of the invention, the current distribution means comprises a contact area for each current distribution layer, wherein each contact area comprises an exposed portion of that current distribution layer for connecting that current distribution layer to a power supply. Preferably, the exposed portion of a current distribution layer is arranged on one side of the contact layer stack to allow comfortable access to the exposed area. Alternatively, a current distribution layer could be accessed through the substrate by means of a suitable via. The contact layer stack itself could be arranged in the substrate as part of the actual substrate, for example in the case of a top-emitting multi-device OLED.

To connect an electrode to its current distribution layer, an appropriate electrical connection must be made between them. One way of doing this might be to arrange a short conductive pin into each opening of the device layer stack, arranged where appropriate to protrude into a corresponding via of the contact layer stack. However, this approach might be time-consuming to carry out. In a particularly preferred embodiment of the invention, an electrical connector between an electrode and a current distribution layer comprises a globule of electrically conductive paste placed in an opening and/or in a via. For example, a droplet of electrically conductive paste such as a silver ink can be precisely deposited in an opening onto an exposed electrode area, or in a via onto an exposed region of a current distribution layer. With the printing processes currently available, very small droplets or globules with a width of about 50 μm can be precisely applied. Furthermore, the viscous properties of such pastes or inks can be chosen so that the applied droplet does not spread to any significant degree. Therefore, such a droplet can be positioned precisely in an opening or via such that no contact is made between the outer surfaces of the droplet and the inner walls of the opening or via. An opening and/or via is preferably dimensioned so that a gap of about twice the droplet width is left free all around the droplet.

When the multi-device OLED is operational, the active layers emit light and the entire light-emitting area can serve as a lighting element. An essentially uninterrupted light-emitting area is desirable for many lighting applications. Therefore, in a particularly preferred embodiment of the invention, an opening and/or a via comprises an essentially circular cavity with a diameter in the region of 200 µm-300 µm. Of course, the openings or vias can have any cross-sectional shape and need not necessarily be circular. In this way, the cross-sectional area of each opening or cavity can be kept at a minimum, while still allowing electrical contacts to be made between the exposed electrode and current distribution layer regions. A grid or mesh could be formed by forming narrow channels instead of round openings or vias, and other arrangements are also conceivable. Different combinations are also possible, for example a mesh or grid of openings on the device layer stack, combined with circular vias in the contact layer stack. Openings can be formed in the device layer stack such that adjacent or neighbouring openings are separated by about 20 mm (millimeters). Openings with small cross-sectional area and distributed with such a spacing may allow an optimal current distribution through the electrodes of the OLED without resulting in significant 'holes' in the light-emitting area that might otherwise detract from the visual appearance of the OLED. For many lighting applications, these dimensions can ensure a homogenous, uninterrupted light-emitting area.

As mentioned above, an inter electrode is generally very thin in order to deliver the desired transparency. On account of its being so thin, such an inter electrode would difficult to contact by means of an opening through the device layer stack, since the step of removing material of the device layer stack may well also remove the material of the inter electrode. Therefore, in a particularly preferred embodiment of the invention, the step of assembling the device layer stack comprises the steps of forming an isolated region or "conductor island" of the bottom electrode, applying a full-area coating of a first active layer over the bottom electrode to also cover the isolated region, removing material of the first active layer to expose the isolated region; and applying an inter electrode over the first active layer to also cover the exposed isolated region. An electrical connection is therefore made between the island and the inter electrode, while the inter electrode is still isolated from the bottom electrode by the active layer sandwiched between them. Since the bottom electrode is applied onto a rigid substrate, material of the device layer can be accurately removed down to the level of the bottom electrode but without removing material of the bottom electrode itself. Therefore, by appropriately dimensioning the islands and any space between the island and the bottom electrode, and by precisely controlling the process of removing device layer material, an opening can be formed to expose only the surface of the island while preserving any electrical contact between the conductor island and the inter electrode. Preferably, the area of an island is only slightly larger or smaller than the cross-sectional area of an opening later formed to access that island. Also the opening is preferably formed relative to the island so that the perimeter of one 'encloses' the perimeter of the other, for example in a concentric manner in the case of an essentially circular island and an essentially circular opening.

Material of the device layer stack can be removed using any suitably precise technique. For example, cavities or openings can be formed by milling through the top electrode down to the desired level in the device layer stack. However, because of the tool size, it may be necessary to mill the openings one after another, which might be too time-consuming to be satisfactory. Another alternative might be to use a plasma etching process. In a particularly preferred embodiment of the invention, however, the step of forming an opening to expose a contact region of an electrode comprises performing laser ablation or laser patterning to remove material of the device layer stack above that electrode. One or more laser beams can be directed at the device layer stack to exactly remove material to give precisely formed cavities or openings, exposing the desired electrode regions.

In a preferred embodiment of the invention, the step of assembling a current distribution means comprises assembling a contact layer stack wherein current distribution layers of the contact layer stack are electrically isolated by an insulating layer. For example, for a two-device OLED, a first insulating layer can be applied onto the inside surface of a cover lid, which itself can be conductive and can act as a current distribution layer. Alternatively, a conductive layer can be applied to a non-conductive lid to act as the first current distribution layer. A second current distribution layer can be applied over the first insulating layer, and a second insulating layer can be applied onto the second current distribution layer. Finally, a third current distribution layer can be applied onto the second insulating layer, so that three current distribution layers are applied for the three electrodes of the two-device OLED. These layers can be applied using any suitable technique such as spin coating, sputtering, vapour deposition, etc. A suitable choice of material might be to use aluminium for the current distribution layers and aluminium oxide for the insulation layers. Of course, other material could be used as appropriate.

To access the current distribution layers, the method according to the invention also comprises the step of forming a via to expose a contact region of a current distribution layer of the contact layer stack, whereby such a via can be formed using any of the removal techniques described above. However, a laser ablation process may be preferable on account of the advantages of precision and speed.

Evidently, the lowest current distribution layer will face the top electrode when the contact layer stack is positioned over the device layer stack. In one embodiment, the openings and vias can be arranged so that the top electrode can be connected to the top (i.e. upper or topmost) current distribution layer through vias extending into the contact layer stack, so that the overall thickness of the multi-device OLED is kept optimally low. An electrical connector for connecting the top electrode to the corresponding current distribution layer can simply be printed onto the top electrode. Similarly, an electrical connector for connecting the bottom electrode to the corresponding current distribution layer, for example the lowest current distribution layer, can simply be printed onto the current distribution layer or dropped into the corresponding opening in the device layer stack. An electrical connector for connecting an inter electrode to the corresponding current distribution layer, for example the middle current distribution layer, can simply be printed onto the current distribution layer in the corresponding via or onto the inter electrode in the corresponding opening in the device layer stack. Preferably, therefore, a via is formed in the contact layer stack to correspond to an opening of the device layer stack such that an exposed region of an electrode lies vis-à-vis an exposed contact region of the current distribution layer for that electrode when the contact layer stack is placed over the device layer stack.

In a particularly preferred embodiment of the invention, the step of applying an electrical connector comprises printing a globule of electrically conductive paste onto an exposed contact region of an electrode, or onto an exposed contact region of a current distribution layer. Evidently, the globules can be printed using any suitable printing technique such as laser-printing or nano-printing, and several globules can be printed simultaneously. An entire array of globules can be printed in one printing step to place a globule in each opening of the device layer stack (or contact layer stack) and at appropriate positions on the top electrode (or lowest current distribution layer).

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the diagrams, like numbers refer to like objects throughout. Elements of the diagrams are not necessarily drawn to scale. In particular, the layer thicknesses of the OLED devices are shown greatly exaggerated, as are the dimensions of the openings and vias through the OLED device layers.

DETAILED DESCRIPTION OF THE EMBODIMENTS

Figure 1:
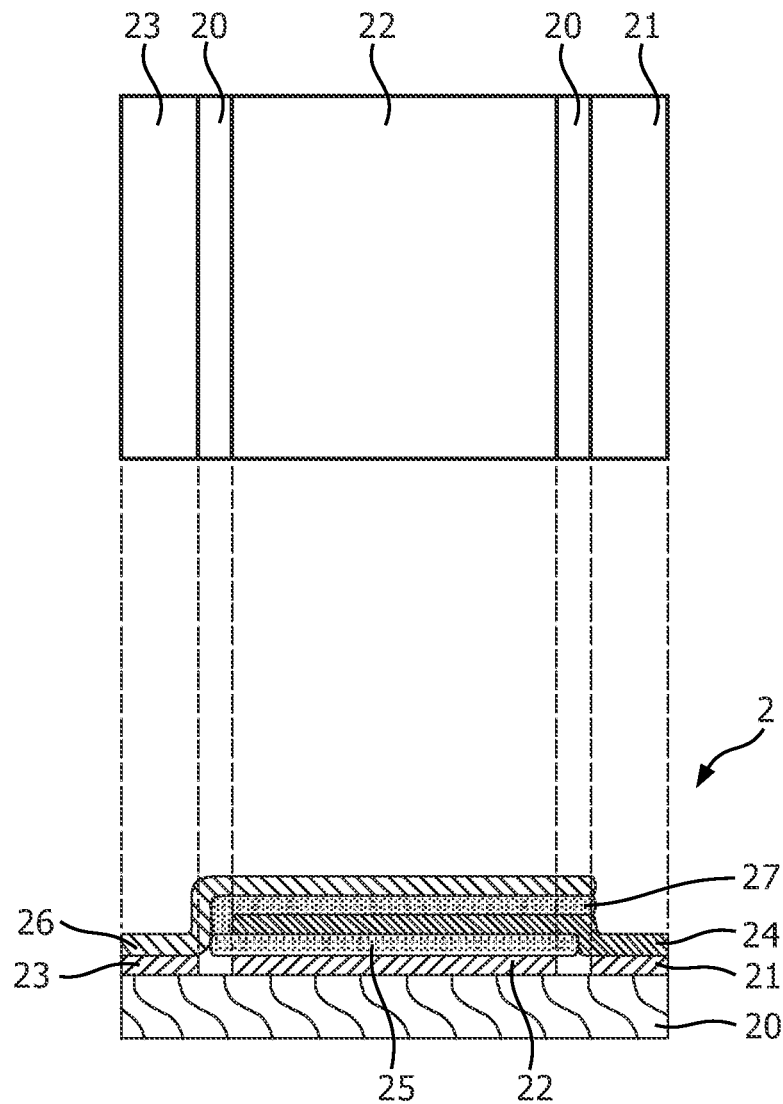
FIG. 1 shows a simplified cross-section through a prior art multi-device OLED.

FIG. 1 shows a cross-section through a prior art multi-device OLED 2. For the sake of clarity, only the relevant elements are shown, and in a greatly simplified manner. The prior art manufacturing process involves applying an anode 22 onto a substrate 20, flanked by but separated from a cathode contact pad 23 and a contact pad 21 for an inter electrode 24. These electrically separate regions 21, 22, 23 are shown in the upper part of the diagram as they would appear in a plan view. Only the area covered by the anode 22 will be useful as a light-emitting area of the finished device. Once these areas 21, 22, 23 have been applied, a first active layer 25 is applied over the anode 22 only. An inter electrode 24 is applied onto the active layer 25 and also onto the appropriate contact pad 21. A second active layer 27 is deposited over the inter electrode 24. This second active layer 27 can have a different colour than the first active layer 25. Finally, a cathode 26 is applied over the second active layer 27 and onto the cathode contact pad 23. When complete, the device 2 can be controlled by applying a first voltage across the cathode 26 and the inter electrode 24, and by applying a second voltage across the inter electrode 24 and the anode 22. In this way, the colour of the emitted light can be adjusted or tuned. However, the poor lateral conductivity of the inter electrode 24 and the anode 22 effectively limit the practicable device size.

Figure 2:
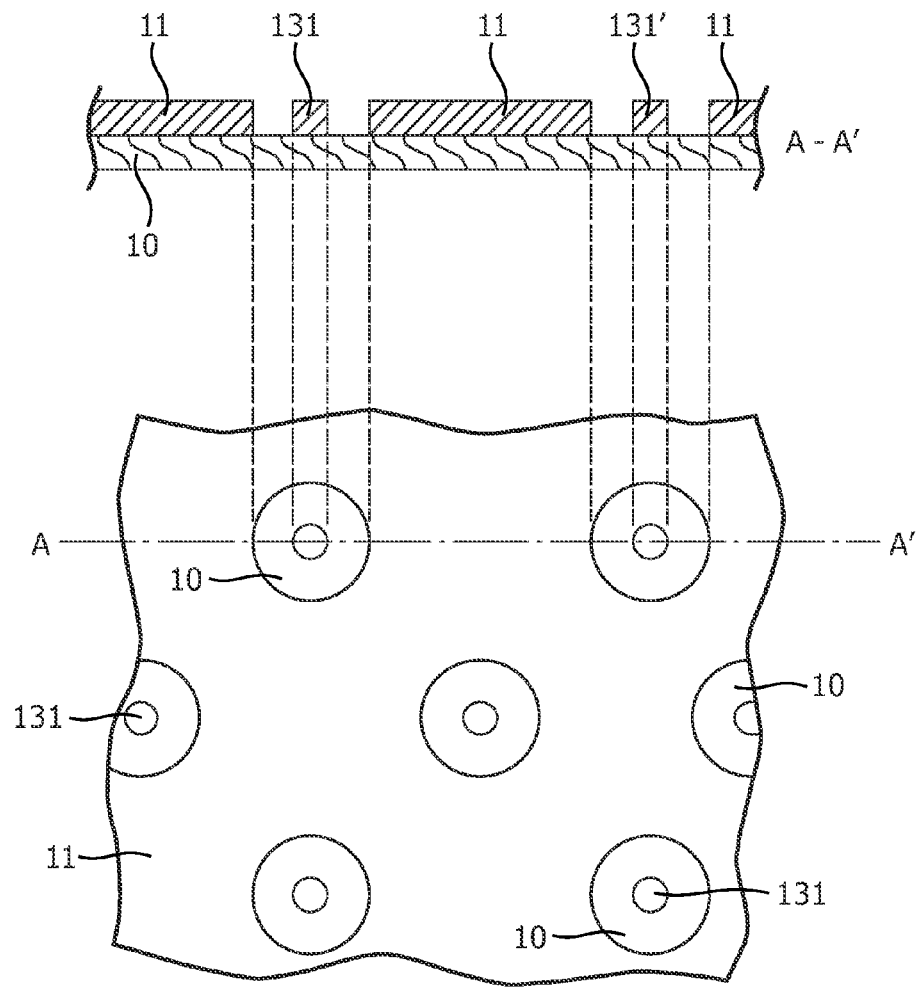
FIG. 2 shows a cross-section and plan view of a substrate and bottom electrode for a device layer stack of a multi-device OLED according to the invention.

FIG. 2 shows a schematic representation of a substrate 10 and bottom electrode 11 for a device layer stack 100 of a multi-device OLED according to the invention, and a cross-section A-A' through the substrate 10 and bottom electrode 11. The bottom electrode 11 is applied to the substrate 10 using a suitable technique, for example spin coating. An island 131 is formed in the electrode 11, for example by performing photolithography or laser ablation to remove material of the bottom electrode 11, leaving an exposed annular region of the substrate 10, as shown in the lower part of the diagram. The islands 131 can be very small, for example with a cross-sectional area in the region of 0.7 $mm^2$ to 1.0 $mm^2$ (square millimeters).

Figure 3:
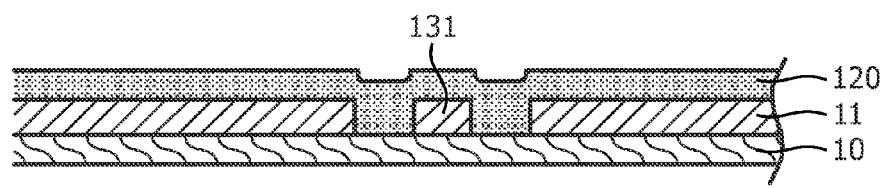
FIG. 3 shows process steps in the manufacture of a device layer stack of a multi-device OLED according to the invention.
Figure 3:
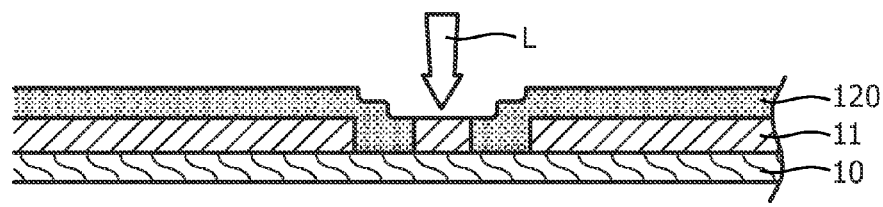
Figure 3:
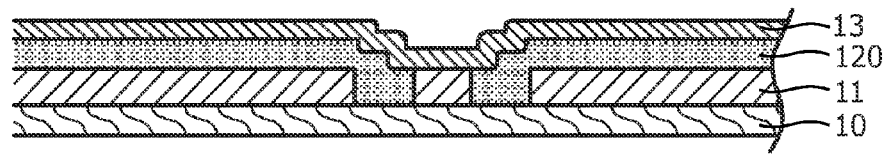
Figure 3:
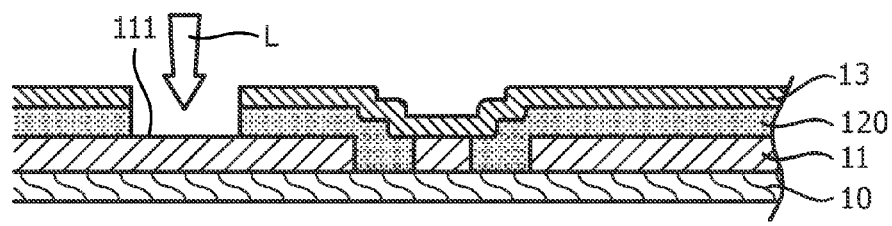
Figure 3:
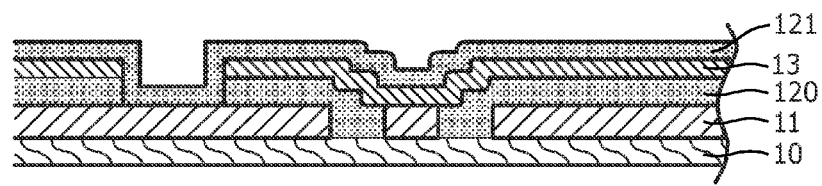
Figure 3:
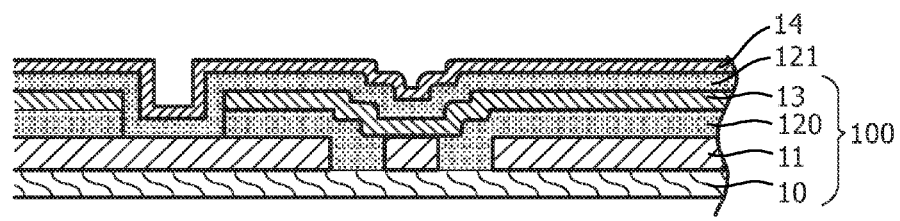
Figure 3:
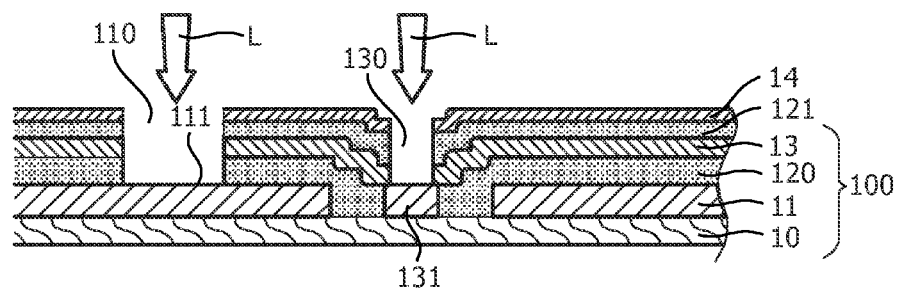

FIG. 3 shows process steps in the manufacture of a device layer stack 100 of a multi-device OLED according to the invention, using a substrate 10 and bottom electrode 11 prepared in the manner described using FIG. 2 to form a plurality of islands 131. In a first step A, a first active layer 120 is applied over the entire surface of the bottom electrode 11, also covering the islands 131 and the exposed annular regions of the substrate 10.

In a second step B, a laser beam L is used to remove material of the active layer 120 in the region of the island 131, thus exposing the upper surface of the island 131.

In a third step C, an inter electrode 13 is applied over the entire surface of the layer stack. This inter electrode 13 makes contact with the exposed upper surface of the island 131.

In fourth step D, a laser beam L is used to remove material of the inter electrode 13 and the active layer 120 to expose a region 111 of the upper surface of the bottom electrode 11. The area of this exposed bottom electrode region 111 can be in the order of several hundred square micrometers, for example large enough to later accommodate a droplet or globule. Evidently, the size of the exposed area is preferably chosen to comfortably accommodate the droplet with enough space all around the droplet, ensuring that the droplet does not touch any side walls.

In a fifth step E, a second active layer 121 is applied over the entire layer stack.

In a sixth step F, a top electrode 14 is applied over the entire layer stack. In a final step G, laser ablation is performed to re-expose the bottom electrode region 111 and the island 131. In this way, a first opening 110 is formed to access the bottom electrode 11, and a second opening 130 is formed to access the inter electrode 13 using the island 131.

Figure 4:
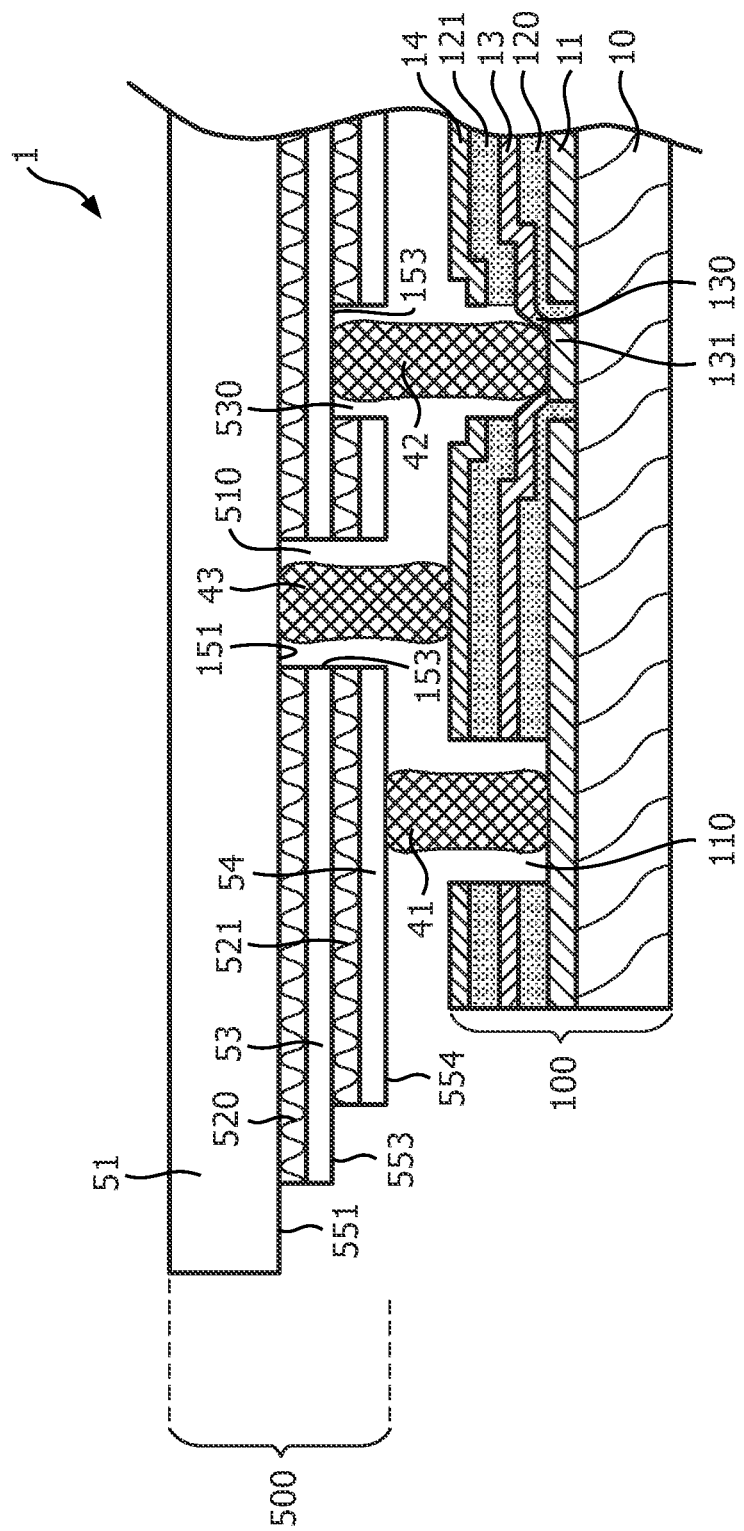
FIG. 4 shows a device layer stack and a contact layer stack of a multi-device OLED according to the invention.

FIG. 4 shows a device layer stack 100 and a contact layer stack 500 of a multi-device OLED 1 according to the invention. The diagram shows how the electrodes 11, 13, 14 of the OLED 1 are connected to current distribution layers 51, 53, 54 in order to apply a voltage across a first OLED device given by the bottom electrode 11, first active layer 120 and inter electrode 13; and to apply a voltage across a second OLED device given by the inter electrode 13, the second active layer 121 and the top electrode 14. The connections between the device layer stack 100 and the contact layer stack 500 or multi-polar lid 500 are made by globules 41 and 42, of an electrically conductive paste dropped or printed into the openings 110, 130, respectively, and by globule 43 of an electrically conductive paste dropped or printed into the opening 151, of the device layer stack 100. To allow the globules to make contact with the correct current distribution layers, corresponding vias 510, 530 are formed in the contact layer stack 500 to expose contact regions 511, 531 of the current distribution layers 51, 53. In this way, a first globule 41 printed into the first opening 110 makes contact with the lowest current distribution layer 54; a second globule 42 printed into the second opening 130 makes contact with the middle current distribution layer 53 through a via 530 in the contact layer stack 500; and a third globule 43 printed onto the top electrode 14 makes contact with the upper current distribution layer 51 through a via 510 in the contact layer stack 500.

The gaps between the globules 41, 42, 43 and the conductive materials of the surrounding electrodes 13, 14 and current distribution layers 53, 54 are sufficient to ensure that these cannot be short-circuited. The globules can be cured in a curing step to harden the globules and improve the conductivity of the material used. Of course, the globules can be printed or deposited into the vias of the contact layer stack (instead of into the openings in the device layer stack) if such a curing step would result in damage to the layers of the device layer stack.

Figure 5:
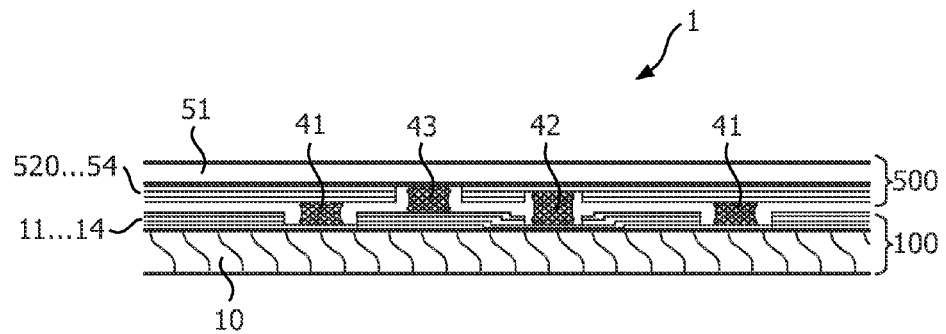
FIG. 5 shows a cross-section through the device layer stack and the contact layer stack of a multi-device OLED according to the invention.

FIG. 5 shows a more realistic (but still exaggerated) cross-section through the device layer stack 100 and the contact layer stack 500 of a multi-device OLED 1 according to the invention. The combined thickness of the device layer stack (not including the substrate) can be in the order of 60 nm to 500 nm. The contact layer stack 500 or multi-polar cover lid can have a thickness in the order of 50 μm. Here, the electrodes and active layers are indicated by the thin layers on top of the substrate 10, which can be glass or another suitable transparent material. The current distribution layers and insulating layers are also simply indicated as thin layers underneath a metal cover lid, which can be some suitable reflective material such as aluminium or silver. The globules 41, 42, 43 are shown to connect the appropriate layers.

Figure 6:
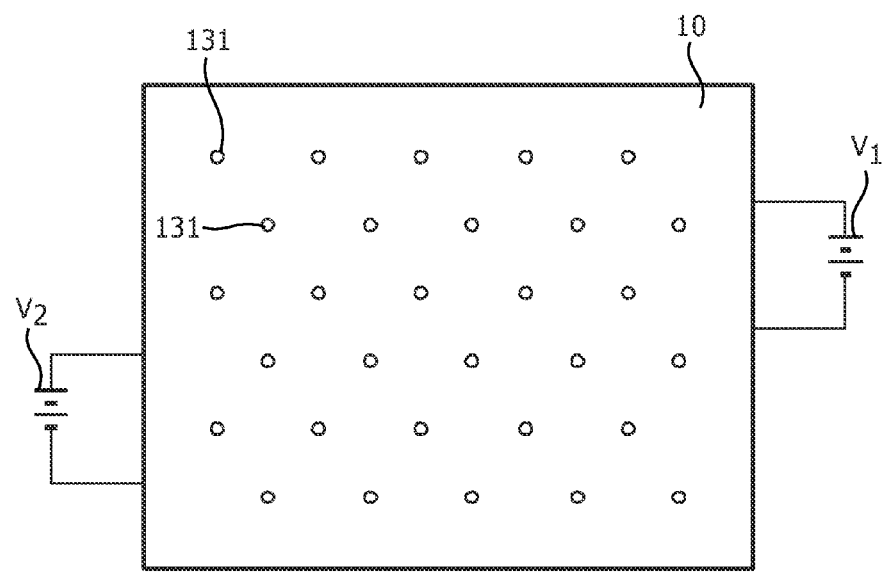
FIG. 6 shows a simplified schematic representation of a plan view of the light-emitting side of the multi-device OLED of the invention.

FIG. 6 shows a plan view of the light-emitting side of the multi-device OLED 1 of the invention. Two power supplies $V_1, V_2$ are used to control the OLED devices to tune the colour of the emitted light. When operating, the light emitting area effectively covers the entire device area. Only those very small areas required by the globules or printed dots to contact the exposed anode regions 111 and the islands 131 will not emit light, since no active layer material is present in these regions 111, 131.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art from a study of the drawings, the disclosure, and the appended claims.

For the sake of clarity, it is to be understood that the use of "a" or "an" throughout this application does not exclude a plurality, and "comprising" does not exclude other steps or elements. The mere fact that certain measures are recited in mutually different dependent claims does not indicate that a combination of these measures cannot be used to advantage. Any reference signs in the claims should not be construed as limiting the scope.

The invention claimed is:

1. A multi-device OLED comprising:
   a device layer stack comprising a bottom electrode comprising a plurality of isolated regions each comprising a first side and a second side, a top electrode, at least one inter electrode and a plurality of active layers, wherein the bottom electrode is applied to a substrate and each active layer is enclosed between two electrodes, wherein at least one isolated region of the plurality of isolated regions is separated from other portions of the bottom electrode adjacent to the first side and the second side of the at least one isolated region by a first active layer, wherein the first active layer is in direct contact with the first side and the second side of the at least one isolated region and with other portions of the bottom electrode adjacent to the first side and the second side of the at least one isolated region;
   a current distribution means comprising a current distribution layer for each electrode of the device layer stack;
   a plurality of openings extending from the top electrode into the device layer stack, wherein each opening exposes a contact region of either the at least one inter electrode or the bottom electrode, wherein the contact region of the at least one inter electrode electrically contacts the at least one of said plurality of isolated regions; and
   a plurality of electrical connectors, wherein each electrical connector extends into an opening such that the electrical connector electrically connects an electrode exposed by that opening to a current distribution layer designated for that electrode.

2. A multi-device OLED according to claim 1, wherein the current distribution means comprises a contact layer stack with a plurality of insulating layers, wherein each insulating layer is sandwiched between two current distribution layers.

3. A multi-device OLED according to claim 2, wherein the current distribution means comprises a plurality of vias extending into the contact layer stack wherein each via exposes a contact region of a current distribution layer.

4. A multi-device OLED according to claim 2 wherein the current distribution means comprises a contact area for each current distribution layer, wherein each contact area comprises an exposed portion of that current distribution layer for connecting that current distribution layer to a power supply.

5. A multi-device OLED according to claim 4, wherein an electrical connector between an electrode and a current distribution layer comprises a globule of electrically conductive paste placed in an opening and/or in a via.

6. A method of manufacturing a multi-device OLED, the method comprises the steps of
   assembling a device layer stack comprising a bottom electrode, a top electrode, at least one inter electrode and a plurality of active layers, wherein the bottom electrode is applied to a substrate, and each active layer is enclosed between two electrodes, wherein the step of assembling the device layer stack comprises the steps of
   forming a plurality of isolated regions of the bottom electrode each comprising a first side and a second side,
   applying a first active layer over the bottom electrode to also cover the plurality of isolated regions, wherein at least one isolated region of the plurality of isolated regions is separated from other portions of the bottom electrode adjacent to the first side and the second side of the at least one isolated region by the first active layer, wherein the first active layer is in direct contact with the first side and the second side of the at least one isolated region and with the other portions of the bottom electrode adjacent to the first side and the second side of the at least one isolated region,
   removing a portion of material of the first active layer to expose portions of the plurality of isolated regions; and
   applying an inter electrode over the first active layer to also cover some of the portions of the exposed plurality of isolated regions;
   assembling a current distribution means comprising forming a current distribution layer for each electrode of the device layer stack;
   forming a plurality of openings extending from the top electrode into the device layer stack, wherein each opening exposes either a contact region of the at least one inter electrode or a contact region of the bottom electrode; and positioning an electrical connector into each opening to electrically connect the electrode exposed by that opening to the current distribution layer designated for that electrode.

7. A method according to claim 6, wherein the step of forming an opening to expose a contact region of an electrode comprises performing laser ablation to remove material of the device layer stack above that electrode.

8. A method according to claim 6, wherein the step of assembling a current distribution means comprises assembling a contact layer stack wherein current distribution layers of the contact layer stack are electrically isolated from each other by a corresponding insulating layer.

9. A method according to claim 8, further comprising a step of forming a via to expose a contact region of a current distribution layer of the contact layer stack.

10. A method according to claim 9, wherein the via is formed to correspond to a designated opening of the device layer stack, such that an exposed region of an electrode in the device layer stack lies vis-a-vis an exposed contact region of the current distribution layer for that electrode when the contact layer stack is placed over the device layer stack.

11. A method according to claim 10, wherein the step of positioning the electrical connector comprises printing a globule of an electrically conductive paste onto an exposed contact region of the electrode.

\* \* \* \* \*